United States Patent
Paak et al.

(10) Patent No.: US 7,567,449 B2
(45) Date of Patent: Jul. 28, 2009

(54) ONE-TIME-PROGRAMMABLE LOGIC BIT WITH MULTIPLE LOGIC ELEMENTS

(75) Inventors: Sunhom Paak, San Jose, CA (US);
Hsung Jai Im, Cupertino, CA (US);
Boon Yong Ang, Santa Clara, CA (US)

(73) Assignee: XILINX, Inc., San Jose, CA (US)

( * ) Notice: Subject to any disclaimer, the term of this patent is extended or adjusted under 35 U.S.C. 154(b) by 321 days.

(21) Appl. No.: 11/588,775

(22) Filed: Oct. 27, 2006

(65) Prior Publication Data

US 2008/0101146 A1     May 1, 2008

(51) Int. Cl.
*G11C 17/00*     (2006.01)

(52) U.S. Cl. ............... 365/96; 365/225.7; 365/189.08

(58) Field of Classification Search ............. 365/96,
365/225.7, 189.08, 185.15, 185.26, 233,
365/185.28

See application file for complete search history.

(56) References Cited

U.S. PATENT DOCUMENTS

| | | | |
|---|---|---|---|
| 5,200,652 A | 4/1993 | Lee | |
| 5,412,593 A | 5/1995 | Magel et al. | |
| 5,970,003 A | 10/1999 | Miyatake et al. | |
| 6,356,496 B1 | 3/2002 | Carroll et al. | |
| 6,643,760 B2 * | 11/2003 | Troutman et al. | 711/212 |
| 7,218,567 B1 * | 5/2007 | Trimberger et al. | 365/228 |
| 7,420,842 B1 * | 9/2008 | Ahrens et al. | 365/185.15 |
| 2004/0057293 A1 | 3/2004 | Roehr et al. | |
| 2005/0275426 A1 * | 12/2005 | Hsu | 326/38 |
| 2006/0006494 A1 | 1/2006 | Wu | |
| 2006/0022300 A1 | 2/2006 | Wu et al. | |
| 2006/0072364 A1 * | 4/2006 | Yoshida et al. | 365/225.7 |
| 2006/0152959 A1 * | 7/2006 | Jung et al. | 365/94 |
| 2007/0002660 A1 * | 1/2007 | Hsieh | 365/225.7 |

FOREIGN PATENT DOCUMENTS

DE     10056590     5/2002

OTHER PUBLICATIONS

Kothandaraman, C. et al., "Electrically Programmable Fuse (eFUSE) Using Electromigration in Silicides", IEEE Electron Device Letters, Sep. 2002, pp. 523-525, vol. 23, No. 9, available from IEEE, 3 Park Avenue, 17th Floor, New York, NY 10016-5997.

* cited by examiner

*Primary Examiner*—Dang T Nguyen
(74) *Attorney, Agent, or Firm*—Scott Hewett; John J. King

(57) ABSTRACT

A memory cell with a logic bit has a first one-time-programmable ("OTP") memory element providing a first OTP memory element output and a second OTP memory element providing a second OTP memory element output. A logic operator coupled to the first OTP memory element output and to the second OTP memory element output and provides a binary memory output of the memory cell. In a particular embodiment, the first OTP memory element is a different type of OTP memory than the second OTP memory element.

16 Claims, 4 Drawing Sheets

US 7,567,449 B2

ONE-TIME-PROGRAMMABLE LOGIC BIT WITH MULTIPLE LOGIC ELEMENTS

FIELD OF THE INVENTION

This invention relates generally to integrated circuits, and more particularly to integrated circuits incorporating one-time-programmable logic memory.

BACKGROUND OF THE INVENTION

One-time-programmable ("OTP") memory elements are used in integrated circuits ("IC") to provide non-volatile memory ("NVM"). Data in NVM are not lost when the IC is turned off. NVM allows an IC manufacturer to store lot number and security data on the IC, for example, and is useful in many other applications. Devices commonly known as fuses and anti-fuses are examples of OTP memory elements.

Other types of devices, such as flash memory, are also used to provide NVM in ICs; however, incorporating flash memory in a CMOS IC adds significant cost because extra processing steps are typically required. Many types of fuses exist, such as polysilicon fuses, metal fuses, contact fuses and via fuses, that are compatible with standard CMOS processing. However, high-density OTP memory is typically less reliable and has a lower programming yield than similarly sized flash memory. It is therefore desirable to provide OTP memory elements with better reliability and yield.

SUMMARY OF THE INVENTION

A memory cell with a logic bit has a first one-time-programmable ("OTP") memory element providing a first OTP memory element output and a second OTP memory element providing a second OTP memory element output. A logic operator coupled to the first OTP memory element output and to the second OTP memory element output and provides a memory output of the memory cell. In a particular embodiment, the first OTP memory element is a different type of OTP memory than the second OTP memory element.

DETAILED DESCRIPTION OF THE DRAWINGS

Figure 1:
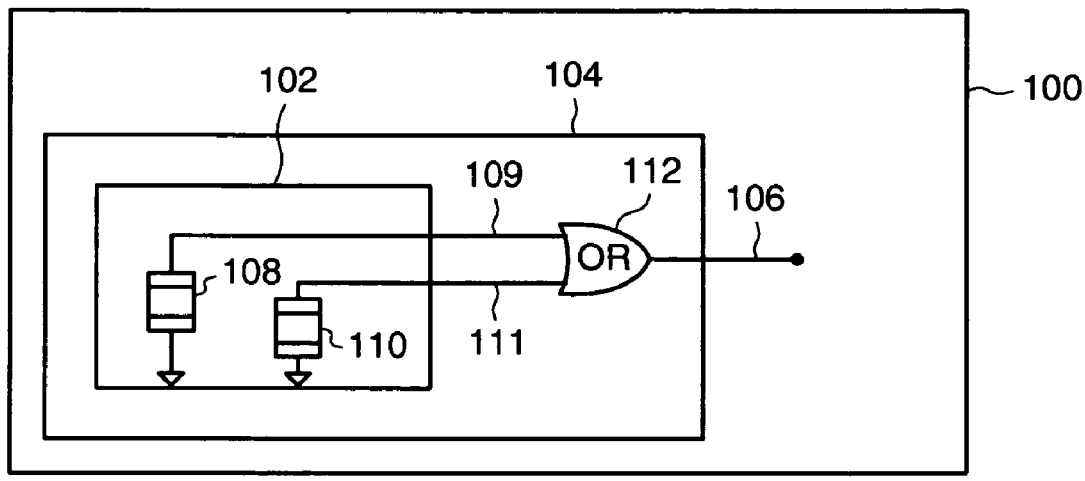
FIG. 1 is a diagram of an IC with a memory element according to an embodiment of the invention.

FIG. 1 is a diagram of an IC 100 with a logic bit 102 according to an embodiment of the invention. The logic bit 102 is part of a memory cell 104 that provides a datum at an output 106. The datum is a binary "1" or "0" logic value, for example, and is typically read by other circuitry of the IC (not shown). Additional parts of the memory cell 104, such as sense amplifiers and latches (see FIG. 2), are familiar to those of skill in the art of OTP memory, and are omitted for simplicity and clarity of illustration.

The logic bit 102 has two OTP memory elements 108, 110, such as two fuses. In a particular embodiment, the first OTP memory element 108 is a first type of fuse and the second OTP memory element 110 is a second type of fuse. For example, the first OTP memory element is a poly-silicon-based fuse ("poly-fuse") and the second OTP memory element is a thin-film metal fuse, or the first OTP memory element is a narrow poly-fuse and the second OTP memory element is a wide poly-fuse. The term "type" of fuse is used to denote that the first type of OTP memory element is intentionally different from the second type of element. In an alternative embodiment, the first OTP memory element is a first type of fuse, and the second OTP memory element is the same type of fuse as the first. Although providing two OTP memory elements in a single logic bit consumes more area of the IC chip, the improved yield and reliability of the resultant NVM make logic cells with redundant OTP memory elements desirable.

In general, different types of fuses program differently during a programming process. In a given programming process (e.g., applying a 10 mA current to the fuse at a programming voltage of about 3.3 V for about 500 micro-seconds to about 1200 micro-seconds), fuse elements are converted from a relatively low resistance condition (typically about 100 Ohms to about 300 Ohms) to a relatively high resistance condition (typically about 10 kOhms to greater than about 100 MOhms). It is desirable that the final (programmed) resistance be sufficiently different from the initial (unprogrammed) resistance to easily distinguish between the programmed and unprogrammed conditions, which represent different logic states when the fuses are used as memory elements.

Fuse elements in a memory array will have a distribution of both unprogrammed resistance and programmed resistance that arises from physical variations in the manufacturing process and in the programming process. That is, fuse links will have slight variations in width, thickness, and conductivity that will affect the initial and final resistance, as well as programmability. Even heat dissipation from a fuse link can add a variation to programmed resistance. A programming process is typically optimized for a type of fuse, but process variations can affect the programming results (final resistivity distribution (sense current distribution) and yield). For example, a weakly programmed fuse (e.g., a fuse having a programmed resistance of about 1 kOhm) may pass the program verification, but become more conductive over time, causing a reliability failure.

Providing two OTP memory elements 108, 110 in a single logic bit 102 improves yield (particularly programmed yield) and reliability of OTP-based on-chip memory. While advantages are obtained using the same type of OTP memory elements in a logic bit, using two different types of OTP memory elements in a single logic bit is particularly desirable because such an arrangement provides wider margins for both manufacturing and programming process.

The outputs 109 and 111 of the OTP memory elements 108 and 110, respectively, are provided to logic operator ("gate") 112, which in this example is an OR gate. The logic operator 112 provides the logic output 106 of the memory cell 104. For example, if either of the OTP memory elements 108 and 110 is programmed to a logic "1" state, then the memory cell (output 106) will indicate a logic value of "1" for the memory cell 104. In many cases, the second OTP memory element is redundant in that, if the first OTP memory element is successfully programmed, the second OTP memory element does not affect the value of the logic bit. However, if the first OTP memory element fails in either programming or sense (READ), a properly operating second OTP memory element ensures that the logic bit provides the correct value. In a typical application, most or all of the logic bits in an OTP-based NVM memory array include both first and second (i.e., redundant) OTP memory elements. In an exemplary operation, both OTP memory elements 108, 110 are programmed.

In one embodiment, both are programmed using the same programming process. This approach is particularly desirable in embodiments where the first OTP memory element is of a first type, and the second OTP memory element is of a second type, where the types of OTP memory elements have been selected so as to provide high programming yield of at least one of the first type or second type of OTP memory elements during the programming process. Such techniques can be used, for example, when the programming windows (see FIG. 4) for both types of devices overlap; however, this is not essential. In another embodiment, one type of OTP memory element is programmed at the same voltage and current as the second type of OTP memory element, but the programming signal is applied to the different types of OTP memory elements for different lengths of time.

For example, if normal manufacturing variations produce a programmed resistivity for the first type of OTP memory elements that is out-of-specification for a number of logic bits, selecting a second type of OTP memory element that is likely to be successfully programmed when the first type is not successfully programmed enhances programming yield of the logic bits. In a particular example, the first OTP memory element is a first type of poly-fuse having a relatively narrow and short neck (fusible link), and the second type is a poly-fuse having a relatively wide and long neck. In a particular embodiment, the first type of fuse has a neck that is at least 30% more narrow than the neck on the second type of fuse.

The wide fuse could be optimally programmed at one programming condition (e.g., a first programming duration), while the narrow fuse could be optimally programmed at a different programming condition (e.g., a second programming duration). The combination of the two types of OTP devices provides one logical bit. Even though the programming conditions will naturally program some fuses differently than others, providing redundant OTP memory elements in a single logic bit enhances program yield and reliability of the logic bit.

In an alternative embodiment, the first OTP memory element 108 is programmed using a first programming process, and the second OTP memory element 110 is programmed using a second programming process (technique or sequence). The resulting OTP-based memory array has a higher programming yield and improved reliability and sensing margin, compared to a conventional OTP-memory array having only a single OTP memory element for each logic bit.

Figure 2:
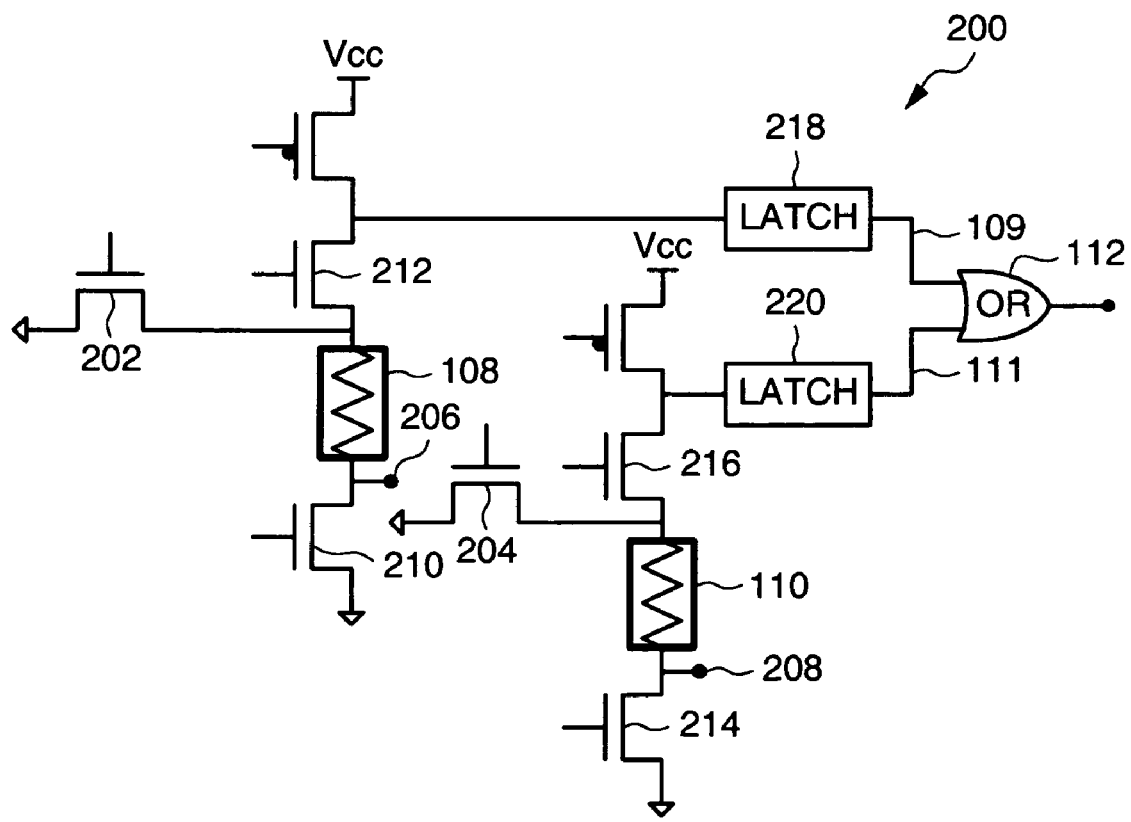
FIG. 2 is a circuit diagram of a memory cell according to an embodiment of the invention.

FIG. 2 is a circuit diagram of a memory cell 200 according to an embodiment of the invention. Memory cells having a single OTP memory element for each logic bit are well-known in the art; therefore, only a brief description of the memory cell and its operation is provided. The memory cell 200 has two OTP memory elements 108 and 110, such as fuses or anti-fuses. In a particular embodiment, the first OTP memory element 108 is of the first type, and the second OTP memory element 110 is of the second type. Program enable transistors 202 and 204 provide current paths for programming current supplied at associated programming pads 206 and 208, respectively. Programming voltage $V_{fs}$ is applied to the programming pads 206 and 208 and the programming transistors 202 and 204 are turned on by applying a programming signal $V_{pp}$ to their gate terminals for a selected period of time $T_{pgm}$. The programming transistors 202, 204 and $V_{pp}$ can be selected to provide the desired programming current through the fuse element during programming.

After programming the OTP memory elements 108 and 110, the logic state (resistivity) of the OTP memory elements is sensed using sense enable transistors 210, 212, 214, 216, as is well known in the art. The sensed logic state for each OTP memory element is captured by associated latches 218 and 220 and the outputs (logic states) 109 and 111 of the OTP memory elements 108 and 110 are provided to the OR gate 112. If one or both of the OTP memory elements indicate a logic "1" state, then the output 106 of the memory cell 200 is "1". Of course, those of skill in the art will appreciate that the logic values and functions chosen in this example are merely exemplary, and other values and functions are alternatively used. For example, both OTP memory elements are alternatively anti-fuse devices, and the logic operator is a NOR gate, or one of the OTP memory elements is a fuse, and the other is an anti-fuse with an inverter between it and an OR operator, or the OR operator is replaced with a NAND operator.

Figure 3:
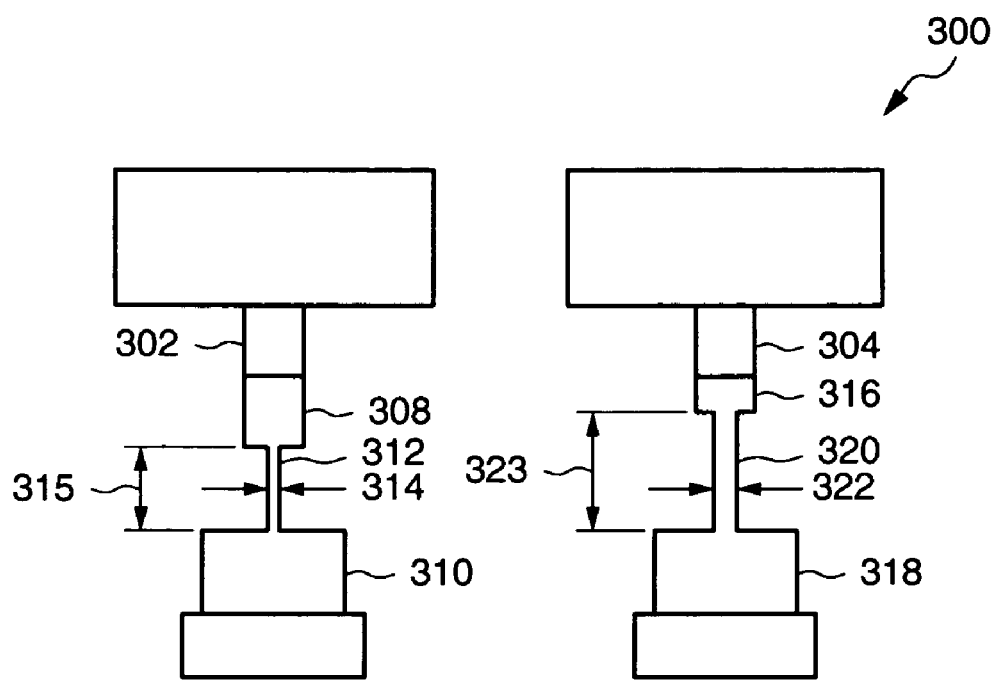
FIG. 3 is a plan view of a memory element with two different types of OTP devices according to an embodiment.

FIG. 3 is a plan view of a logic bit 300 with two different types of OTP devices 302, 304 according to an embodiment. The first OTP device 302 is a narrow poly-fuse having an anode 308, a cathode 310, and a fuse neck 312 having a width 314 and a length 315. The second OTP device 304 is a wide poly-fuse having a second anode 316, a second cathode 318, and a second fuse neck 320 having a second width 322, and a second length 323. The terms "narrow" and "wide" mean that the second fuse neck 320 is designed to be selectively wider than the first fuse neck 312 (i.e., width 322 is greater than width 314).

In a particular embodiment, the first neck 312 is about 80 nm wide and about 800 nm long, and the second neck 320 is about 120 nm wide and about 1.2 micrometers long to keep the same resistance-square ("R-square") value, which provides essentially the same unprogrammed resistance for each type of fuse, so that the same programming current can be used. Fuses are typically programmed one-by-one. Programming current is provided by a programming transistor, and is switched to the fuse, as is known in the art of OTP fuse programming. Providing two different types of OTP devices having essentially the same unprogrammed resistance draws similar current from the programming transistor when each of the devices is being programmed. This allows use of a common, stable, current source when programming both types of fuses. It is desirable to accurately control the current used for programming fuses. Other programming parameters, such as the duration of the programming current, may be separately optimized for each type of fuse. Duration of the current is relatively easy to accurately control and change.

The first and second poly-fuses 302, 304 are fabricated in an IC having the logic bit using a standard CMOS fabrication process. That is, no materials or process steps are required that are not already part of the CMOS IC fabrication technique. This is desirable because it provides OTP-based NVM on the IC without adding additional processes to the IC fabrication sequence.

In one example, the poly fuses are similar to gate structures in a CMOS IC. The fuse necks are fabricated on what is conventionally referred to as the gate dielectric layer, which in a particular example is an STI oxide layer. The fuse neck has a layer of p+-doped poly-silicon formed on the gate dielectric layer, and a layer of silicide, such as nickel silicide, is formed on the poly-silicon. A layer of silicon nitride is formed on the silicide. During programming, the conductive silicide element electro-migrates with the electron flow from cathode to anode, and the silicide of the element will accumulate on the anode side. Therefore, little or no silicide remains in the locality of the fuse neck and the fuse neck now has a high resistance, which will cause Joule heating. The high temperature from this Joule heating depletes dopant species (e.g., boron ions) inside the poly fuse neck to the anode and cathode sides of the fuse. Subsequently, the fuse self-quenches and cools down to become programmed to a very high resistance.

Figure 4:
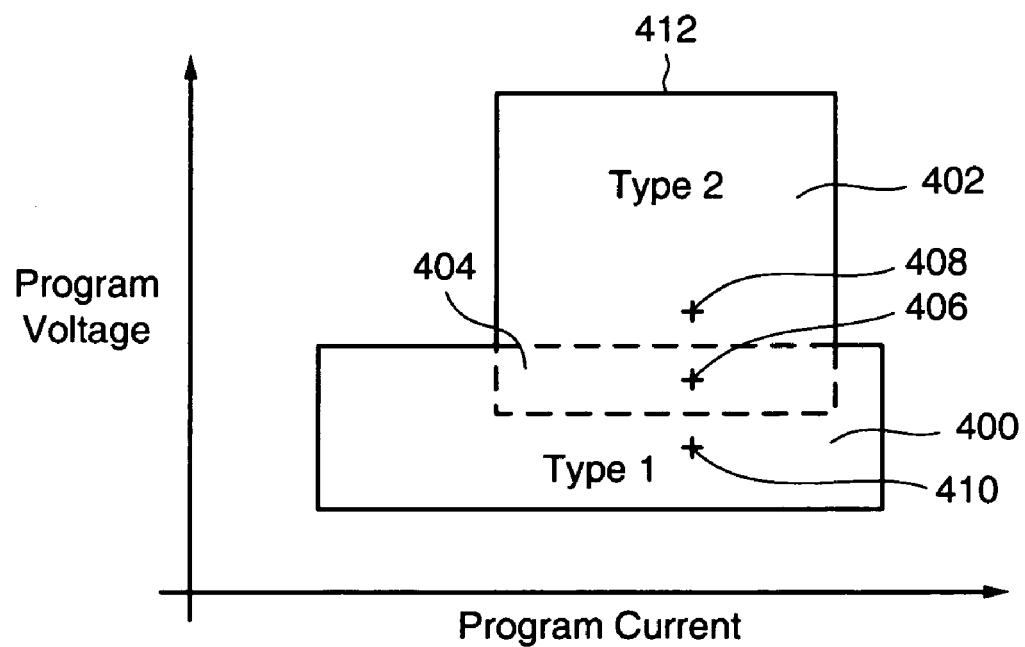
FIG. 4 shows programming conditions for an OTP-type logic bit according to an embodiment.

FIG. 4 shows programming conditions for an OTP-type logic bit according to an embodiment. A first programming process window 400 shows the programming current and voltage conditions that provide reliable programming of a first type (Type 1) of OTP memory element, such as a poly-fuse. A second programming process window 402 shows the programming current and voltage conditions that provide reliable programming of a second type (Type 2) of OTP memory element, such as a second type of poly-fuse. The first and second programming process windows overlap to form an overlap process window 404 (defined by the dashed lines). A programming condition, such as that defined by the current and voltage at 406, should reliably program both Type 1 and Type 2 OTP memory elements. In an alternative embodiment, the programming process windows of the selected of OTP memory elements do not overlap. Note that in alternative embodiments, for even greater reliability, more than two OTP memory elements may be used.

If the program voltage drifts high, for example to point 408, the Type 2 OTP memory element would still be reliably programmed, even though the Type 1 OTP memory element might not be reliably programmed. If the program voltage drifts low, for example to point 410, The Type 1 OTP memory element would still be reliably programmed, even though the Type 2 OTP memory element might not be reliably programmed. The programming process window for a logic bit having both Type 1 and Type 2 OTP memory elements is defined by the solid outer perimeter 412 of the first and second programming process windows 400, 402. A programming condition occurring anywhere within this programming process window 412 would be expected to program at least one of the Type 1 or Type 2 OTP memory elements, and in some instances, reliably program both. Thus, a logic bit according to embodiments is reliably programmed over a greater range of programming conditions than a conventional logic bit having only one type of OTP memory element.

Other programming parameters could be used to similarly illustrate that logic bits having different types of OTP memory elements provide improved programming yield over a wider range of programming and OTP memory element fabrication process variations.

Test chips were fabricated with two different types of poly-fuses using a 65 nm CMOS fabrication process. A first programming process was used to program the first type of poly-fuse, and a second programming process was used to program the second type of poly-fuse. The two types of programming processes were optimized for each type of fuse. The test chips were evaluated for programming quality (programmed resistance). The data obtained from these test chips showed better programming reliability and programming yield of logic bits.

Figure 5:
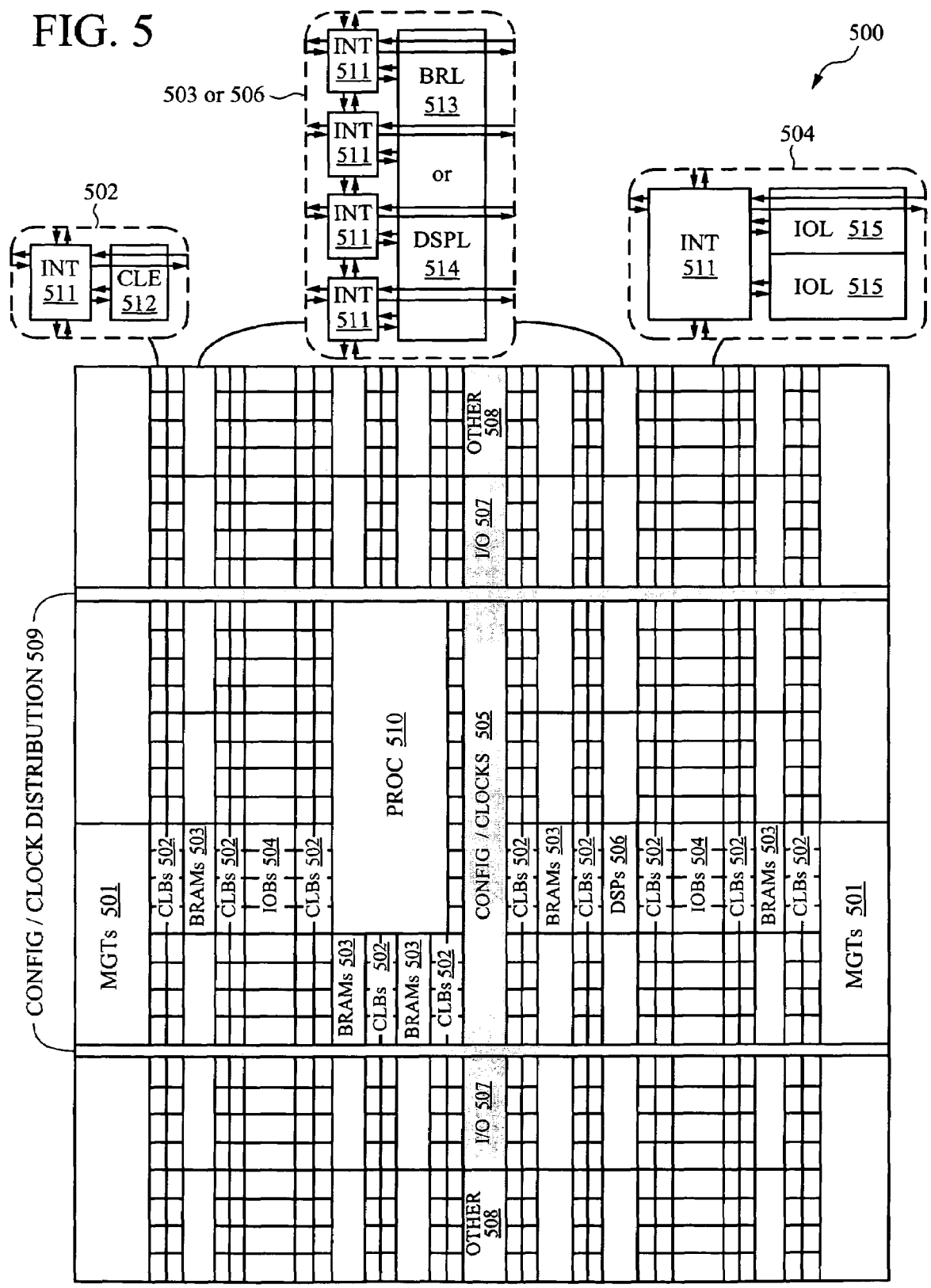
FIG. 5 is a plan view of an FPGA according to an embodiment.

FIG. 5 is a plan view of an integrated circuit 500 according to an embodiment of the invention. The integrated circuit is an FPGA (field programmable gate array) that includes CMOS portions in several of the functional blocks, such as in RAM and logic, and is fabricated using a CMOS fabrication process. Logic bits having multiple OTP memory elements according to one or more embodiments of the invention are incorporated in any of several functional blocks of the IC, such as a memory block, logic block, I/O block, clock circuit, transceiver, or other functional block; within many functional blocks; or within a physical section or segment of the FPGA 500. Logic bits having redundant (dual) OTP memory elements (e.g., fuses) according to embodiments of the invention are particularly desirable in FPGAs because they provide reliable, secure on-chip NVM for a variety of purposes. For example, they may be used for component identification, or to avoid having to download the data stored in the on-chip NVM from an external source to the IC, which can be time consuming and can be intercepted. In another example application, on-chip OTP NVM according to an embodiment may be used to de-crypt (for example by storing one or more decryption keys) a bitstream transferred from an external source to the FPGA, such as data or a configuration file. For instance, an un-encrypted configuration bitstream could be intercepted during transmission. Design security in FPGAs may be enabled by encrypting the configuration bitstream, and using the OTP-based NVM on the FPGA to decrypt the configuration bitstream. Storing an on-chip encryption/decryption key in OTP NMV requires relatively little memory, and thus consumes little space on the IC. Although dual-OTP memory element memory arrays consume more chip area than single-OTP memory element memory arrays, this penalty is minor, and is worth the enhanced manufacturability and reliability. Another example use of dual-OTP memory element memory is to store a small number of bits (typically 100 bits or less) to provide a digital tuning function, such as tuning an on-chip amplifier or oscillator. Embodiments of the invention provide easily manufactured, reliable on-chip NVM, and incur minimal size penalties in low-density storage applications. The NVM retains its information when power is off, eliminating the need for a battery backup or other continuous power supply to the FPGA.

The FPGA architecture includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507) (e.g., configuration ports and clock ports), and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element (INT 511) also includes the connections to and from the programmable logic element within the same tile, as shown by the examples included at the top of FIG. 5.

For example, a CLB 502 can include a configurable logic element (CLE 512) that can be programmed to implement user logic plus a single programmable interconnect element (INT 511). A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element (INT 511). As will be clear to those of skill in the art, the actual I/O pads connected, for example, to the I/O logic element 515 are manufactured using metal layered above the various illustrated logic blocks, and typically are not confined to the area of the input/output logic element 515. In the pictured embodiment, a columnar area near the center of the die (shown shaded in FIG. 5) is used for configuration, clock, and other control logic.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

Figure 6:
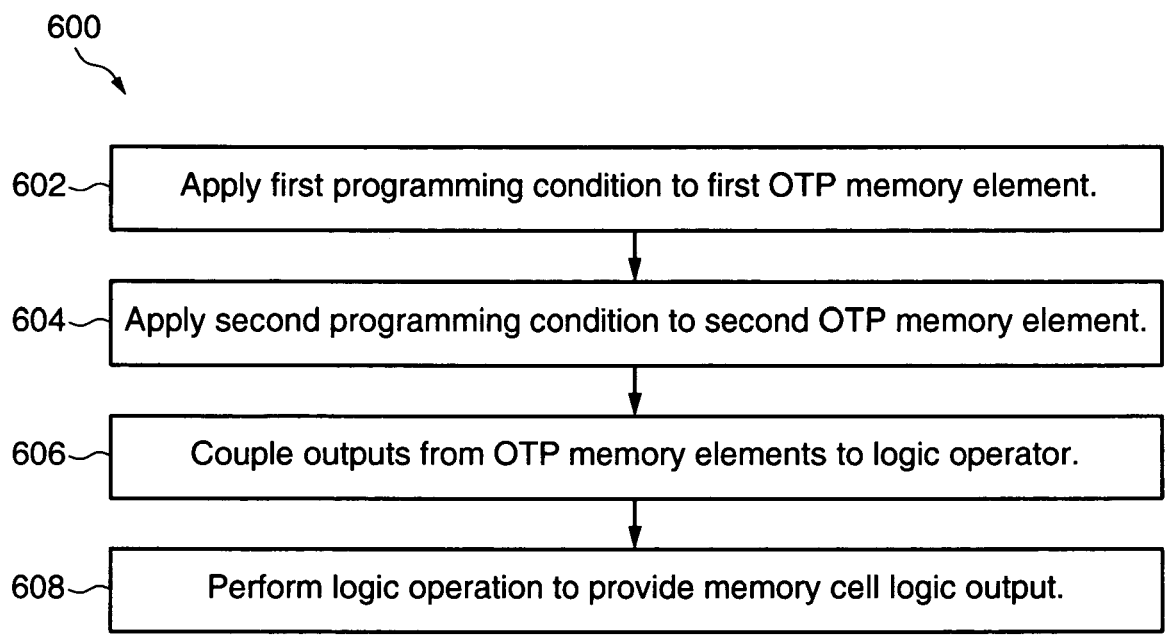
FIG. 6 is a flow chart of a method of operating a memory cell according to an embodiment of the invention.

FIG. 6 is a flow chart of a method 600 of operating a memory cell according to an embodiment of the invention. A first programming condition is applied to a first one-time-programmable ("OTP") memory element in a logic bit (step 602). A second programming condition is applied to a second OTP memory element in the logic bit (step 604).

In a particular embodiment, the first programming condition (e.g., programming voltage, programming current, and current pulse duration) is the same as the second programming condition. In an alternative embodiment, the first programming condition is optimized for programming the first OTP memory element, and the second programming condition is optimized for programming the second OTP memory element. In a particular embodiment, the first programming condition has a first programming process window, and the second programming condition has a second programming process window. The first programming process window at least partially overlaps the second programming process window to form an overlap programming process window for the logic bit.

A first memory element output from the first OTP memory element and a second memory element output from the second OTP memory element in the logic bit are coupled to a logic operator of the memory cell (step 606), and the logic operator is operated (step 608) so as to provide a logic output from the memory cell according to the first memory element output, the second memory element output, and the logic operator. In a particular embodiment, the first and second OTP memory elements are fuses, and the logic operator is an OR gate. In a particular embodiment, the logic output from the memory cell is part of a decryption key. In a further embodiment, the logic output from the memory cell is used to decrypt a configuration bitstream of a field programmable gate array. In an alternative embodiment, the logic output from the memory cell provides component identification of an FPGA.

While the present invention has been described in connection with specific embodiments, variations of these embodiments will be obvious to those of ordinary skill in the art. Therefore, the spirit and scope of the appended claims should not be limited to the foregoing description.

What is claimed is:

1. A memory cell comprising:
   a logic bit having
      a first one-time-programmable ("OTP") memory element providing a first OTP memory element output, and
      a second OTP memory element providing a second OTP memory element output; and
   a logic operator coupled to the first OTP memory element output and to the second OTP memory element output and providing a memory output of the memory cell, wherein the first OTP memory element is a first fuse comprising a first selected fuse type, the second OTP memory element is a second fuse comprising a second selected fuse type different from the first selected fuse type, and the logic operator is an OR gate, and wherein the first selected fuse type has a first programming process window and the second selected fuse type has a second programming process window, the first programming process window at least partially overlapping the second programming process window so as to provide a logic bit programming process window.

2. The memory cell of claim 1 wherein the first fuse is a poly-silicon fuse and the second fuse is selected from the group consisting of a metal fuse, a contact fuse, and a via fuse.

3. The memory cell of claim 1 wherein the first fuse is a first poly-silicon fuse having a first fuse neck with a first fuse neck width and the second fuse is a second poly-silicon fuse having a second fuse neck with a second fuse neck width, the second fuse neck width being selectively wider than the first fuse neck width.

4. The memory cell of claim 3 wherein the second fuse neck width is at least 30% wider than the first fuse neck width.

5. The memory cell of claim 3 wherein the first fuse neck has a resistance-square value and the second fuse neck has the resistance-square value.

6. The memory cell of claim 1 wherein the first OTP memory element is a first anti-fuse and the second OTP memory element is a second anti-fuse.

7. The memory cell of claim 1 wherein the first OTP memory element is an anti-fuse and the second OTP memory element is a fuse.

8. An integrated circuit ("IC") comprising:
   a memory cell including
      a logic bit having
         a first one-time-programmable ("OTP") memory element providing a first OTP memory element output, and
         a second OTP memory element providing a second OTP memory element output; and
      a logic operator coupled to the first OTP memory element output and to the second OTP memory element output and providing a memory output of the memory cell, wherein the first OTP memory element is a first fuse comprising a first selected fuse type, the second OTP memory element is a second fuse comprising a second selected fuse type different from the first selected fuse type, and the logic operator is an OR gate, and wherein the first selected fuse type has a first programming process window and the second selected fuse type has a second programming process window, the first programming process window at least partially overlaps the second programming process window so as to provide a logic bit programming process window.

9. The integrated circuit of claim 8 wherein the IC is a complementary metal-oxide-semiconductor (CMOS) IC fabricated using a CMOS fabrication process, and wherein the first OTP memory element and the second OTP memory element are also fabricated using the CMOS fabrication process.

10. The integrated circuit of claim 9 wherein the IC is a field programmable gate array.

11. A method of operating a memory cell comprising:

applying a first programming condition to a first one-time-programmable ("OTP") memory element in a logic bit;

applying a second programming condition to a second OTP memory element in the logic bit;

coupling a first memory element output from the first OTP memory element and a second memory element output from the second OTP memory element in the logic bit to a logic operator of the memory cell; and operating the logic operator so as to provide a memory output from the memory cell according to the first memory element output, the second memory element output, and the logic operator, wherein the first OTP memory element has a first programming process window and the second OTP memory element has a second programming process window at least partially overlapping the first programming process window to form an overlap programming process window, the first programming condition and the second programming condition both being within the overlap programming process window.

12. The method of claim 11 wherein the first OTP memory element is a first fuse and the second OTP memory element is a second fuse, and the logic operator is an OR gate.

13. The method of claim 11 wherein the first programming condition is optimized for programming the first OTP memory element and the second programming condition is optimized for programming the second OTP memory element.

14. The method of claim 11 wherein the memory cell is incorporated in a field programmable gate array and the memory output from the memory cell is a portion of a decryption key.

15. The method of claim 11 further comprising a step, of using the memory output from the memory cell to decrypt a configuration bitstream of a field programmable gate array.

16. The method of claim 11 wherein the memory output from the memory cell provides component identification of a field programmable gate array.

* * * * *